United States Patent
Hirose

(10) Patent No.: US 9,891,265 B2
(45) Date of Patent: Feb. 13, 2018

(54) VOLTAGE DETECTING CIRCUIT AND METHOD FOR MEASURING CHARACTERISTIC OF TRANSISTOR

(71) Applicant: FUJITSU LIMITED, Kawasaki-shi, Kanagawa (JP)

(72) Inventor: Tatsuya Hirose, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 170 days.

(21) Appl. No.: 14/035,016

(22) Filed: Sep. 24, 2013

(65) Prior Publication Data
US 2014/0139206 A1    May 22, 2014

(30) Foreign Application Priority Data
Nov. 22, 2012  (JP) ................ 2012-256687

(51) Int. Cl.
| G01R 15/00 | (2006.01) |
| G01R 31/26 | (2014.01) |
| G01R 1/067 | (2006.01) |
| H01L 21/00 | (2006.01) |

(52) U.S. Cl.
CPC ..... *G01R 31/2621* (2013.01); *G01R 1/06766* (2013.01); *H01L 21/00* (2013.01); *H01L 2221/00* (2013.01); *H01L 2223/00* (2013.01)

(58) Field of Classification Search
CPC . H01L 21/00; H01L 2221/00; H01L 2223/00; H01L 2924/00; H01L 2925/00; H02M 1/00; G01N 1/00; G01N 2201/00; H02J 1/00
USPC ........................................... 324/132
See application file for complete search history.

(56) References Cited

U.S. PATENT DOCUMENTS

| 3,544,881 | A | * | 12/1970 | Nowakowski | .......... H02J 7/166 322/25 |
| 3,571,619 | A | * | 3/1971 | Dickerson | ................ H04J 1/06 327/7 |
| 4,507,618 | A | | 3/1985 | Nelson | |
| 6,130,571 | A | * | 10/2000 | Yamamoto | ................ 327/525 |
| 8,295,020 | B2 | * | 10/2012 | Oki | ........................ H02M 1/08 361/101 |

(Continued)

FOREIGN PATENT DOCUMENTS

| CN | 101324639 A | 12/2008 |
| CN | 101529704 A | 9/2009 |

(Continued)

OTHER PUBLICATIONS

Office Action of corresponding Chinese Patent Application No. 201310492219.3 dated Nov. 16, 2015, with full translation of the Office Action.

(Continued)

*Primary Examiner* — Jermele M Hollington
*Assistant Examiner* — Temilade Rhodes-Vivour
(74) *Attorney, Agent, or Firm* — Kratz, Quintos & Hanson, LLP

(57) ABSTRACT

A voltage detection circuit includes: a transistor; a switch coupled to a drain terminal of the transistor; the drain terminal is coupled to an one end of the switch; a first driver that controls the switch in synchronization with a second driver that drives a gate terminal of the transistor; and a plurality of resistors coupled in series and coupled to an another end of the switch.

5 Claims, 11 Drawing Sheets

(56) References Cited

U.S. PATENT DOCUMENTS

| | | | | |
|---|---|---|---|---|
| 2003/0206021 A1* | 11/2003 | Laletin | ............... | G01R 31/3631 324/426 |
| 2003/0230733 A1* | 12/2003 | Tanaka | ..................... | G01J 5/24 250/553 |
| 2005/0001607 A1* | 1/2005 | Berland | ............ | G01R 31/3277 324/67 |
| 2005/0146295 A1* | 7/2005 | Miyamoto | ............ | B60L 11/123 318/105 |
| 2005/0195669 A1* | 9/2005 | Sim | ......................... | G11C 7/12 365/203 |
| 2005/0231177 A1* | 10/2005 | Tateno | ................ | H02M 3/1588 323/225 |
| 2006/0145708 A1 | 7/2006 | Saito | | |
| 2007/0053122 A1* | 3/2007 | Miyata | ............................ | 361/57 |
| 2007/0296439 A1* | 12/2007 | Feustel et al. | ................. | 324/763 |
| 2008/0191709 A1 | 8/2008 | Mehta | | |
| 2008/0298784 A1* | 12/2008 | Kastner | ..................... | G01P 3/44 388/811 |
| 2008/0309355 A1* | 12/2008 | Nozaki | ............. | G01R 1/06766 324/754.01 |
| 2009/0146714 A1* | 6/2009 | Nakamori | ............ | H03K 17/168 327/170 |
| 2010/0085675 A1 | 4/2010 | Oki | | |
| 2010/0244797 A1* | 9/2010 | Tabata | .................... | H02M 1/32 323/282 |
| 2011/0037453 A1* | 2/2011 | Hulsmann | ............. | G01R 21/10 324/76.75 |
| 2011/0080105 A1* | 4/2011 | Mayer | .................... | H05B 37/02 315/250 |
| 2011/0157935 A1* | 6/2011 | Bancroft | ............. | H02M 3/3388 363/75 |
| 2012/0025800 A1* | 2/2012 | Dettloff | ............... | H04L 25/0272 323/299 |
| 2012/0032733 A1* | 2/2012 | Negoro | .................... | G06F 1/28 327/537 |
| 2012/0120739 A1* | 5/2012 | Fujioka | ................. | G06F 1/3203 365/189.07 |

FOREIGN PATENT DOCUMENTS

| | | |
|---|---|---|
| JP | S59-86322 A | 5/1984 |
| JP | H5-215808 | 8/1993 |
| JP | 2001-004670 A | 1/2001 |
| JP | 2006-184047 A1 | 7/2006 |
| JP | 2008-197099 A1 | 8/2008 |
| JP | 2008-309702 A1 | 12/2008 |

OTHER PUBLICATIONS

Office Action of corresponding Japanese Patent Application No. 2012-256687 dated May 10, 2016, with translation of the relevant part of the Office Action.

Office Acton of corresponding Chinese Patent Application No. 201310492219.3 dated Jun. 14, 2016, with translation of the relevant part of the Office Action.

* cited by examiner

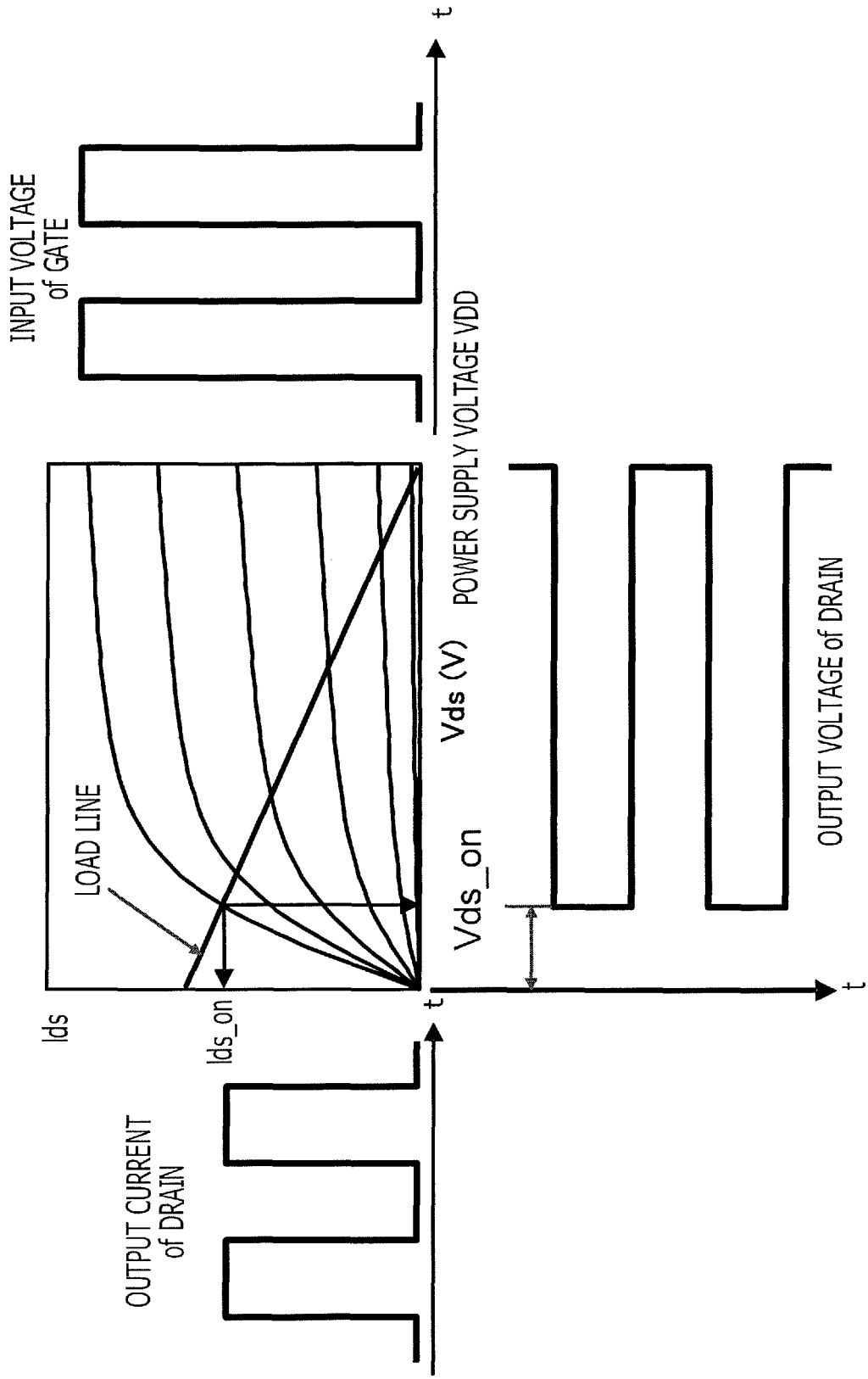

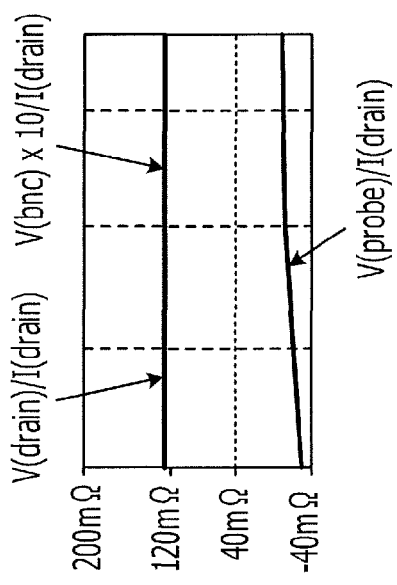
FIG. 10E
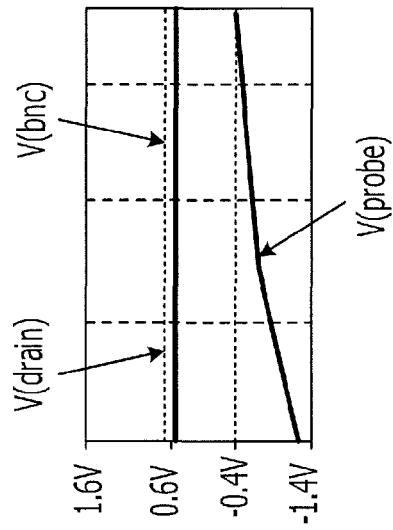
FIG. 10F
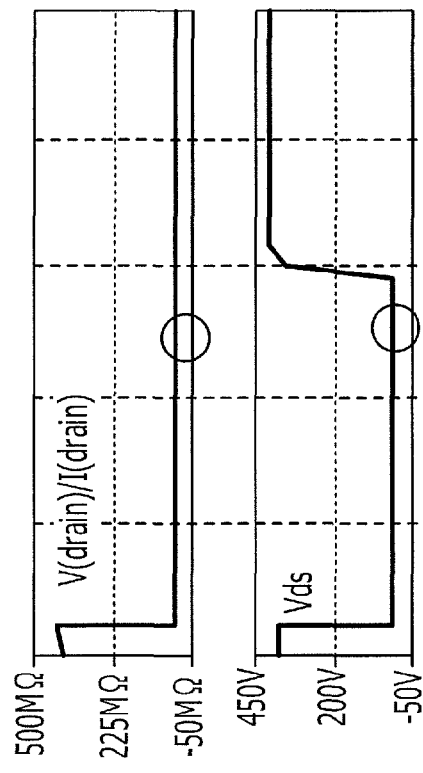
FIG. 10A
FIG. 10B
FIG. 10C
FIG. 10D

VOLTAGE DETECTING CIRCUIT AND METHOD FOR MEASURING CHARACTERISTIC OF TRANSISTOR

CROSS-REFERENCE TO RELATED APPLICATION

This application is based upon and claims the benefit of priority of the prior Japanese Patent Application No. 2012-256687, filed on Nov. 22, 2012, the entire contents of which are incorporated herein by reference.

FIELD

The embodiments discussed herein are related to a voltage detecting circuit for a power transistor and a method for measuring a characteristic of a power transistor.

BACKGROUND

In recent years, as the development of power transistors has proceeded, efforts have been made to increase the performance of high-voltage semiconductor switching elements, such as a field-effect transistor (FET), an insulated gate bipolar transistor (IGBT), a high electron mobility transistor (HEMT) using a gallium nitride (GaN) layer as an electron transit layer, and so forth.

In a power transistor which is used for a switching power supply source, specifically, reducing a loss is an important challenge, and an on-resistance is used as an operation performance index for power transistors.

However, many of recent power transistors perform high-speed operation, and merely using an on-resistance calculated using DC characteristics is not enough as a performance index.

Thus, as an effective performance index used when a switching operation of a power transistor is performed, a dynamic on-resistance Ron is measured.

Referring to FIG. 1, in order to calculate the dynamic on-resistance Ron, a pulse voltage is input to a gate terminal of a power transistor, and calculation is performed, on the basis of an on-current Ids_on and an on-voltage Vds_on flowing in a drain at that time, using the dynamic on-resistance Ron=Vds_on/Ids_on.

FIGS. 2A-2D are charts illustrating waveforms obtained by calculating the switching loss and the dynamic on-resistance Ron from a drain voltage and a drain current when switching of the gate of a power transistor is performed.

In general, where the magnitude of the dynamic on-resistance Ron of a power transistor is dependent on a voltage (an off voltage Vds_off) which is applied when the power transistor is in an off state in many cases. A reason for this is that temperature that the transistor feels varies due to Joule heat generated by a switching loss caused by overlap of the waveform of a drain-source voltage Vds and the waveform of a drain-source current Ids with each other when switching from an off state to an on state or switching from an on state to an off state is performed and a conduction loss caused by Vds_on and Ids_on.

It is also known that, in a power transistor using a chemical semiconductor, current and voltage waveforms are dependent on Vds_off because of the electron and hole trapping level at which electrons and holes existing at a semiconductor surface and an interface are trapped.

The following is reference document:
[Document 1] Japanese Laid-open Patent Publication No. 2008-309702.

SUMMARY

According to an aspect of the invention, a voltage detection circuit includes: a transistor; a switch coupled to a drain terminal of the transistor; the drain terminal is coupled to an one end of the switch; a first driver that controls the switch in synchronization with a second driver that drives a gate terminal of the transistor; and a plurality of resistors coupled in series and coupled to an another end of the switch.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a chart illustrating a dynamic on-resistance;

FIGS. 10A-10F are charts illustrating results of simulation of a case where characteristics of a power transistor are measured using the voltage detection circuit of the second embodiment.

DESCRIPTION OF EMBODIMENTS

Figure 2A:
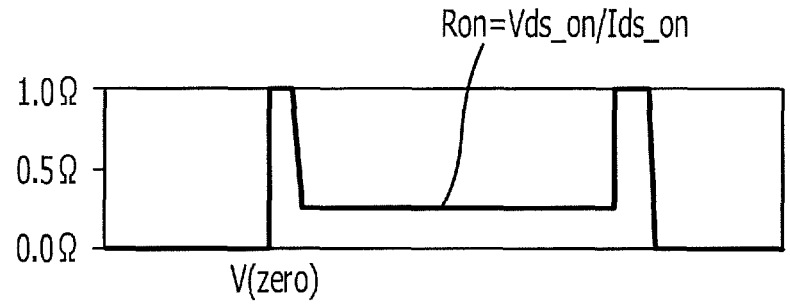
FIGS. 2A-2D are charts illustrating dynamic waveforms of a power transistor.
Figure 2B:
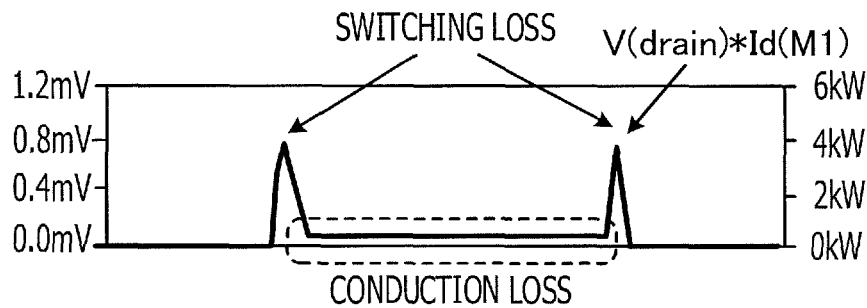
Figure 2C:
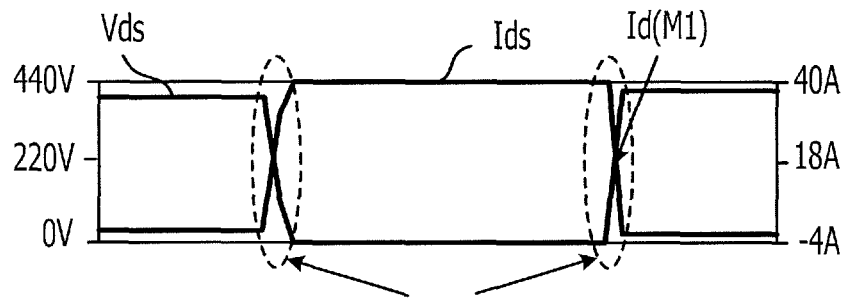
Figure 2D:
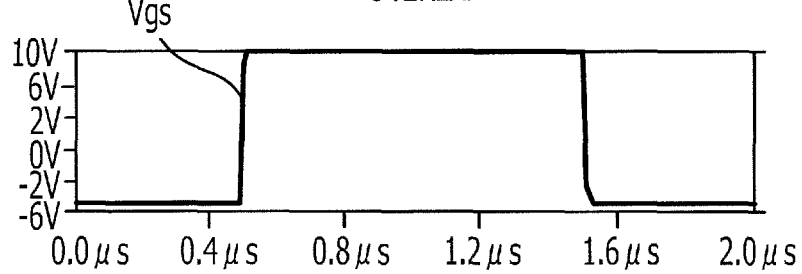
Figure 3:
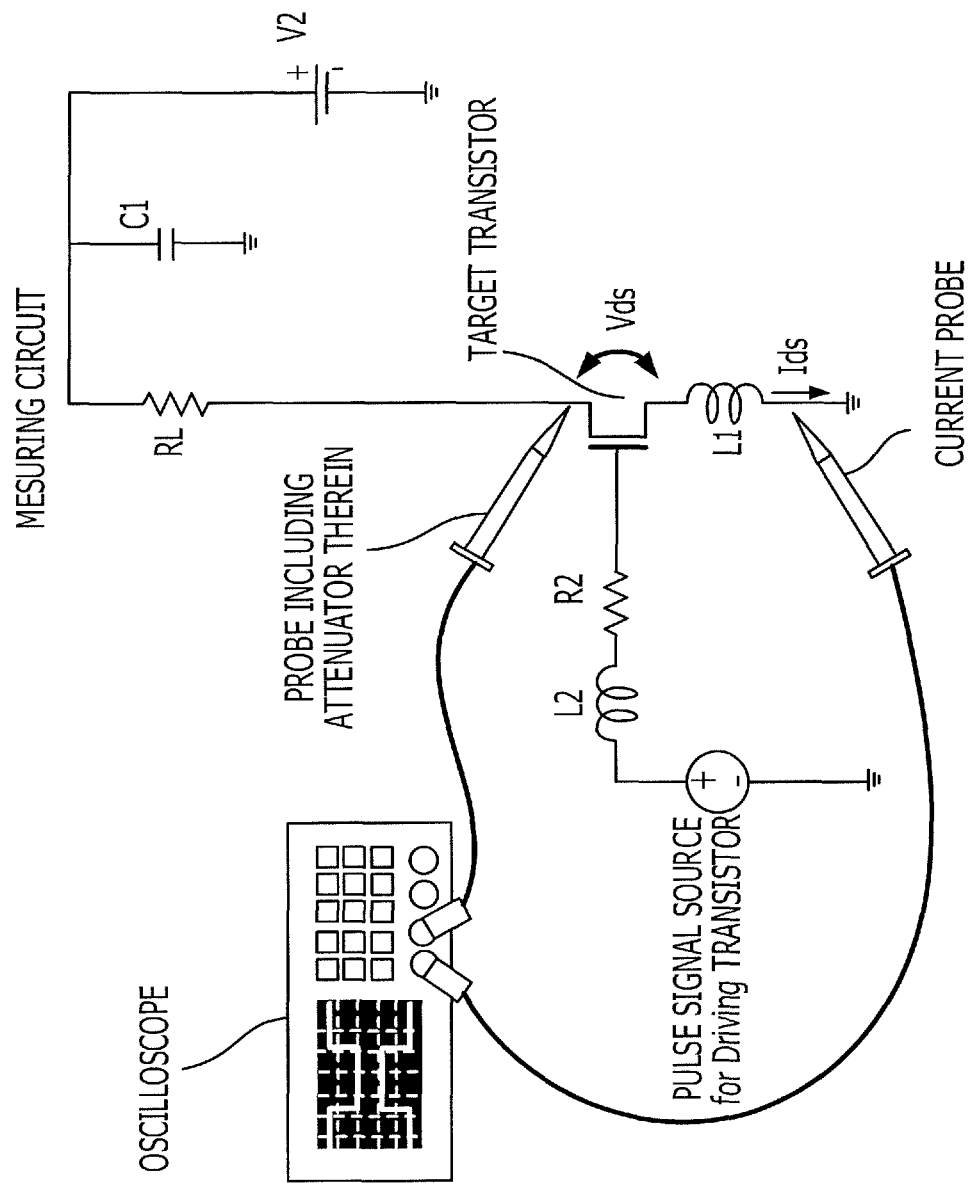
FIG. 3 is a diagram illustrating configurations of a measurement circuit and a measurement device used for measuring the dynamic on-resistance of a power transistor.

FIG. 3 is a diagram illustrating configurations of a measurement circuit and a measurement device used for measuring the dynamic on-resistance Ron of a power transistor.

When the dynamic on-resistance Ron is measured, switching of a gate of a target measurement transistor is performed, thereby measuring a voltage waveform in which a voltage (an off-voltage) of several hundreds volt applied between drain and source terminals during an off-time Toff and a voltage (an on-voltage) of several millivolt during an on-time Ton are temporally repeated at a frequency (=1/(Ton+Toff)) of 100 kHz to several MHz.

Normally, a drain-source voltage of a target measurement transistor using an oscilloscope and a probe including an attenuator, and at the same time, a drain-source current is measured by a current probe.

The setting of a detector gain (a range) of an input terminal of the oscilloscope is in general determined by a higher one (an off-voltage) of voltages which are input.

When a voltage to be measured exceeds an allowable voltage of the input terminal of the oscilloscope, a method in which a voltage that is input to the input terminal of the oscilloscope is further reduced using the probe including the attenuator therein is used.

Figure 4:
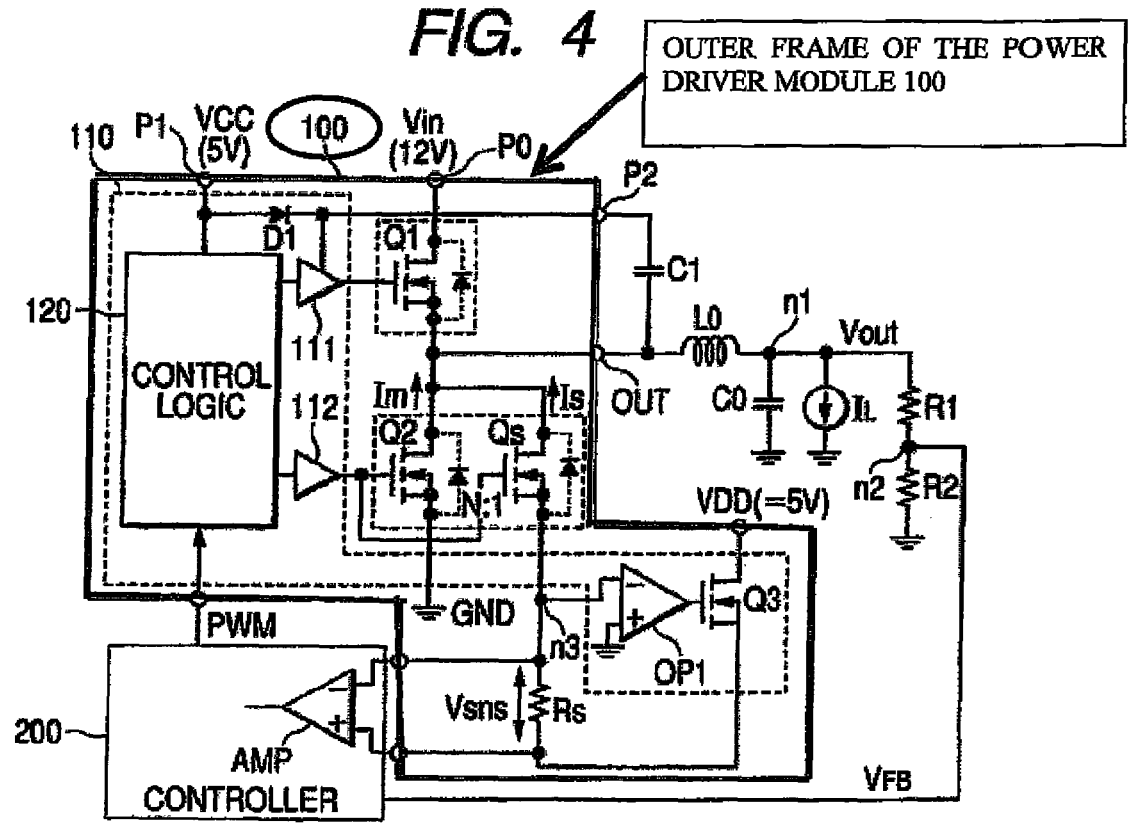
FIG. 4 is an equivalent circuit diagram of a probe including an attenuator therein.

FIG. 4 is an equivalent circuit diagram of a probe including an attenuator therein.

It is known that, when a voltage waveform is measured by an oscilloscope, a time constant ($\tau p=Cp \times Rp$) obtained on the basis of an attenuation resistance Rp and a capacitance Cp of the attenuator and a time constant ($\tau sc=Csc \times Rsc$) obtained on the basis of a resistance Rsc and a capacitance Csc of the input terminal of the oscilloscope are completely matched, and thereby, a waveform observed on the oscilloscope and a waveform of a voltage detected at the end of the probe are theoretically the same.

However, actually, the time constant $\tau p$ and the time constant $\tau sc$ are not completely matched because of a parasitic capacitance, a resistance, an inductance, and so forth, which exist in the probe and the input terminal of the oscilloscope. Specifically, the shorter an on-operation time of a transistor is, the less the degree of matching of the time constants becomes. Also, in a long-time measurement, the values of the attenuation resistance Rp, the capacitance Cp, the resistance Rsc, and the capacitance Csc vary due to change in temperature of a measurement environment to cause a difference between the adjusted time constant $\tau p$ and the adjusted time constant $\tau sc$, and thus, correct measurement is not performed.

Then, the difference between the time constants results in a distortion of a voltage response waveform observed on the oscilloscope. That is, a problem arises in which a low voltage (an on-voltage) is not correctly measured because of an allowable margin of error caused by an input range setting for the oscilloscope and the attenuator.

FIGS. 5A-5F are charts illustrating results of simulation of a case where characteristics of a power transistor are measured by a probe including an attenuator by a calculator in the manner illustrated in FIG. 3.

Specifically, a pulse transmitted from a pulse signal source is input to the gate of the target measurement transistor, response waveforms of resistance values obtained by dividing a drain voltage, a drain current, a gate voltage, and a drain-source voltage which correspond to the pulse by a drain current are simulated.

Figure 5E:
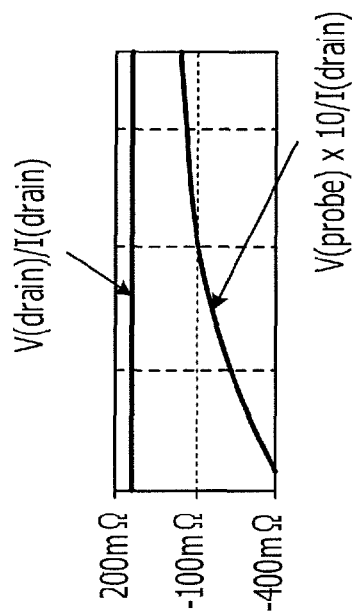
FIGS. 5A-5F are charts illustrating results of simulation of characteristics of a power transistor.
Figure 5F:
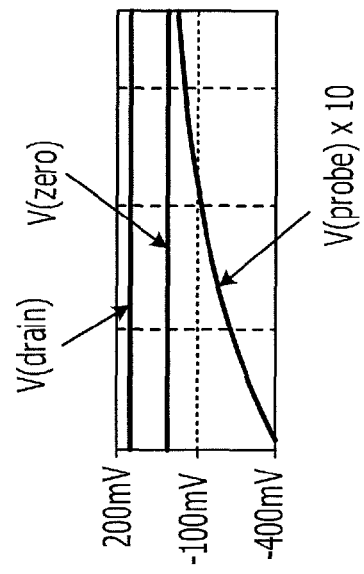
Figure 5A:
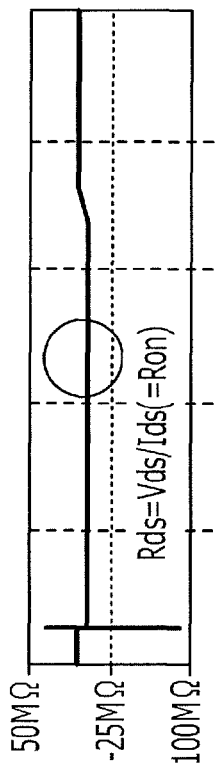
Figure 5B:
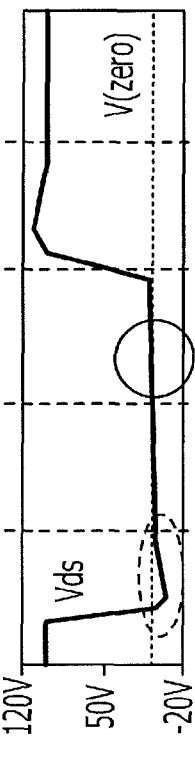
Figure 5C:
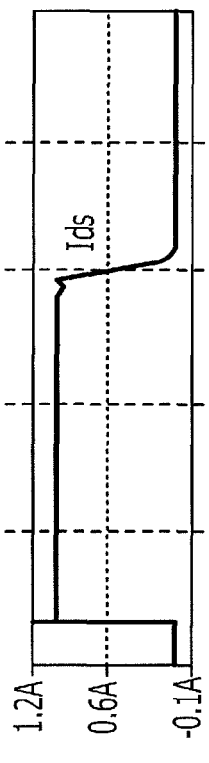
Figure 5D:
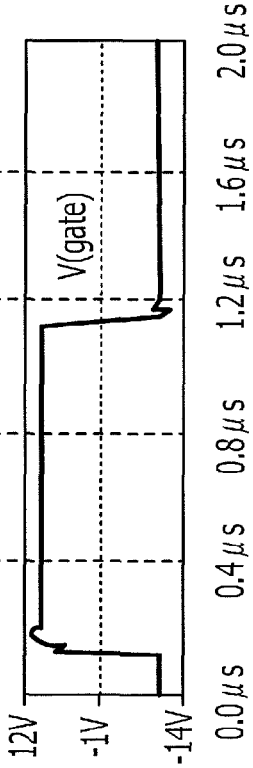

FIG. 5A illustrates a waveform which indicates a value obtained by dividing the drain-source voltage Vds by the drain current Ids and represents an on-resistance in an on-state. FIG. 5B illustrates a pulse response waveform of the drain voltage, FIG. 5C illustrates a response waveform of the drain current, and FIG. 5D illustrates a waveform of an output from a gate driver.

FIG. 5E illustrates an enlarged part of the waveform of FIG. 5A, and FIG. 5F illustrates an enlarged part of the waveform of FIG. 5B. The voltages V (drain) and V (probe) illustrated in FIG. 5F are as follows.

V (drain): a potential of the drain terminal of the target measurement transistor in the measurement circuit of FIG. 3.
V (probe): a potential in the probe terminal of the probe equivalent circuit of FIG. 4.

As illustrated in FIGS. 5A-5F, when the power transistor is switched from off to on, undershoot of the waveform of the drain-source voltage occurs. Then, the value of the on-voltage becomes 0 V or lower, and the on-resistance is not correctly determined.

Even when the voltage that is input to the imputer terminal of the oscilloscope is within an allowable range, if the value of the voltage greatly exceeds a display range, an amplifier installed in an input stage of the oscilloscope causes saturation and a distortion, numerical values displayed on a screen includes a large margin of error, and thus, the evaluation might not be correctly performed.

There is a technique in which a circuit that forcibly clamps a voltage, when an off-voltage is applied, is provided so that an input voltage to the oscilloscope is kept to be less than the allowable voltage of the input terminal of the oscilloscope. However, in this technique, a correct off-voltage is not applied to the power transistor and only an input allowable voltage of the oscilloscope is applied, or the input range of the oscilloscope is not appropriately set for a minimum voltage that is input, and therefore, the off-voltage dependency of the dynamic on-resistance is not correctly evaluated.

Figure 6:
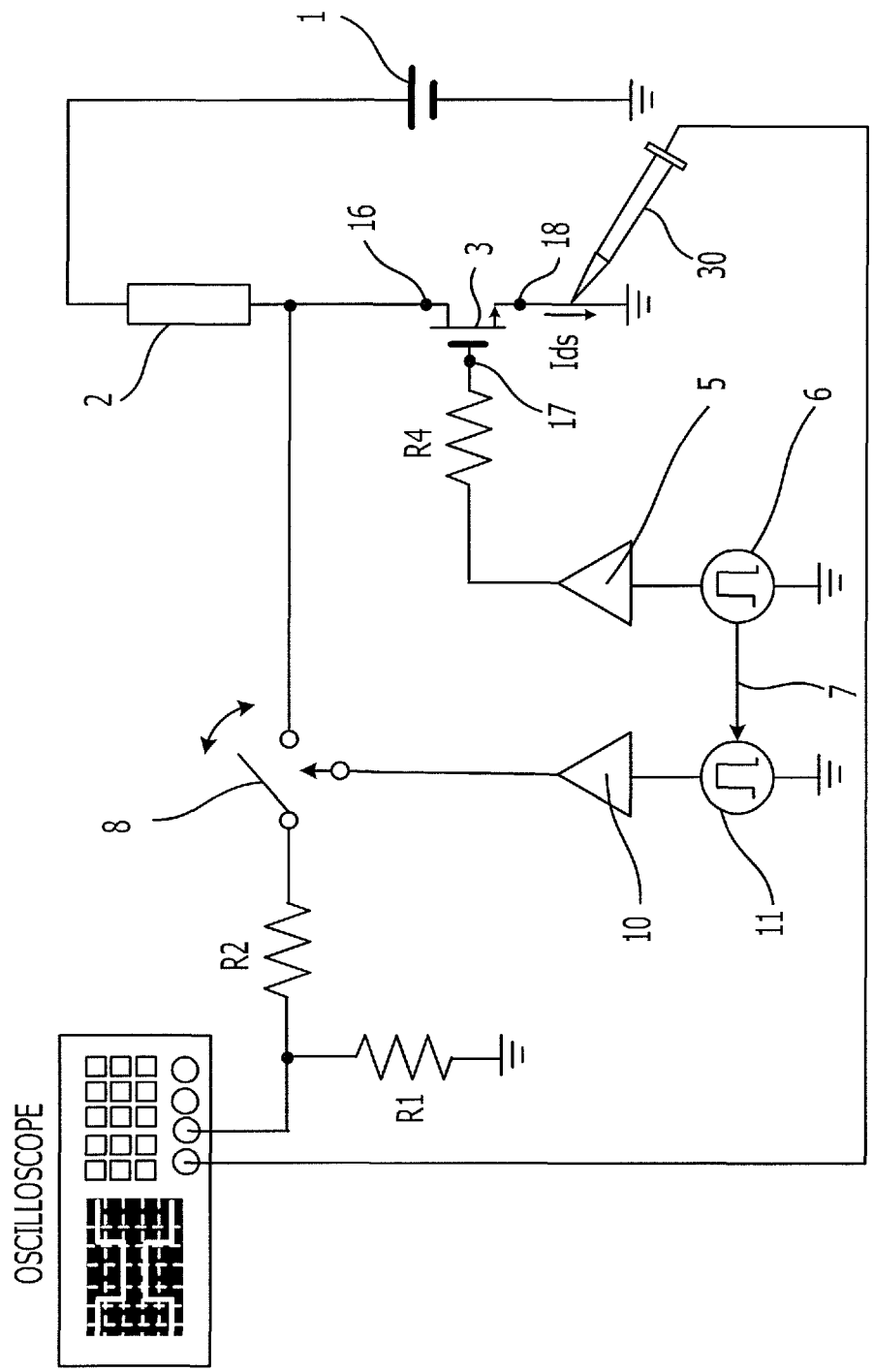
FIG. 6 is a diagram illustrating the principles of the present disclosure.

FIG. 6 is a diagram illustrating the principles of the present disclosure. A drain terminal 16 of a target measurement transistor 3 is connected to one terminal of a load 2 and a source terminal 18 thereof is grounded. The other terminal of the load 2 is connected to a power supply source 1. A gate terminal 17 of the target measurement transistor 3 is connected to one terminal of an oscillation reducing gate resistor R4 and the other terminal of the oscillation reducing gate resistor R4 is connected to an output terminal of a gate driver 5 that drives the target measurement transistor 3. Then, an output terminal of a pulse generator 6 that controls the gate driver 5 is connected to an input terminal of the gate driver 5 that drives the target measurement transistor 3.

A connection node of the drain terminal 16 of the target measurement transistor 3 and the load 2 is connected to one terminal of a switch 8, and the other terminal of the switch 8 is connected to one terminal of a voltage dividing resistor R2. The other terminal of the voltage dividing resistor R2 is connected to one terminal of a voltage dividing resistor R1 and an input of an oscilloscope, and the other terminal of the voltage dividing resistor R1 is grounded.

Opening and closing of the switch 8 is controlled by a gate driver 10, and an output terminal of a pulse generator 11 that controls the gate driver 10 is connected to an input terminal of the gate driver 10. The pulse generator 11 generates a pulse in synchronization with a pulse generated by the pulse generator 6 that controls the gate driver 5 that drives the target measurement transistor 3, and supplies the synchronous pulse to the input terminal of the gate driver 10 that opens and closes the switch 8. That is, the switch 8 is opened and closed in synchronization with the target measurement transistor 3. A voltage of drain voltage$\times$R1/(R1+R2) obtained by dividing the drain voltage of the target measurement transistor 3 by the voltage dividing resistors R1 and R2 is input to the oscilloscope only in a period in which the switch 8 is on.

Concurrently, a drain current Ids flowing at the source side of the target measurement transistor 3 is measured by a current probe 30, and thus, a dynamic on-resistance Ron may be obtained from the drain current Drain current Ids and the drain voltage.

When only an on-voltage time (Ton) of the drain voltage of the target measurement transistor 3 is measured by the oscilloscope, the sensitivity of the input range of the oscilloscope is increased, and furthermore, a probe including an attenuator therein is not used. Thus, the on-voltage is measured with high accuracy. Moreover, measurement is performed after a preferable off-voltage is applied to the power transistor, and thus, the off-voltage dependency of the dynamic on-resistance is correctly evaluated.

Figure 7:
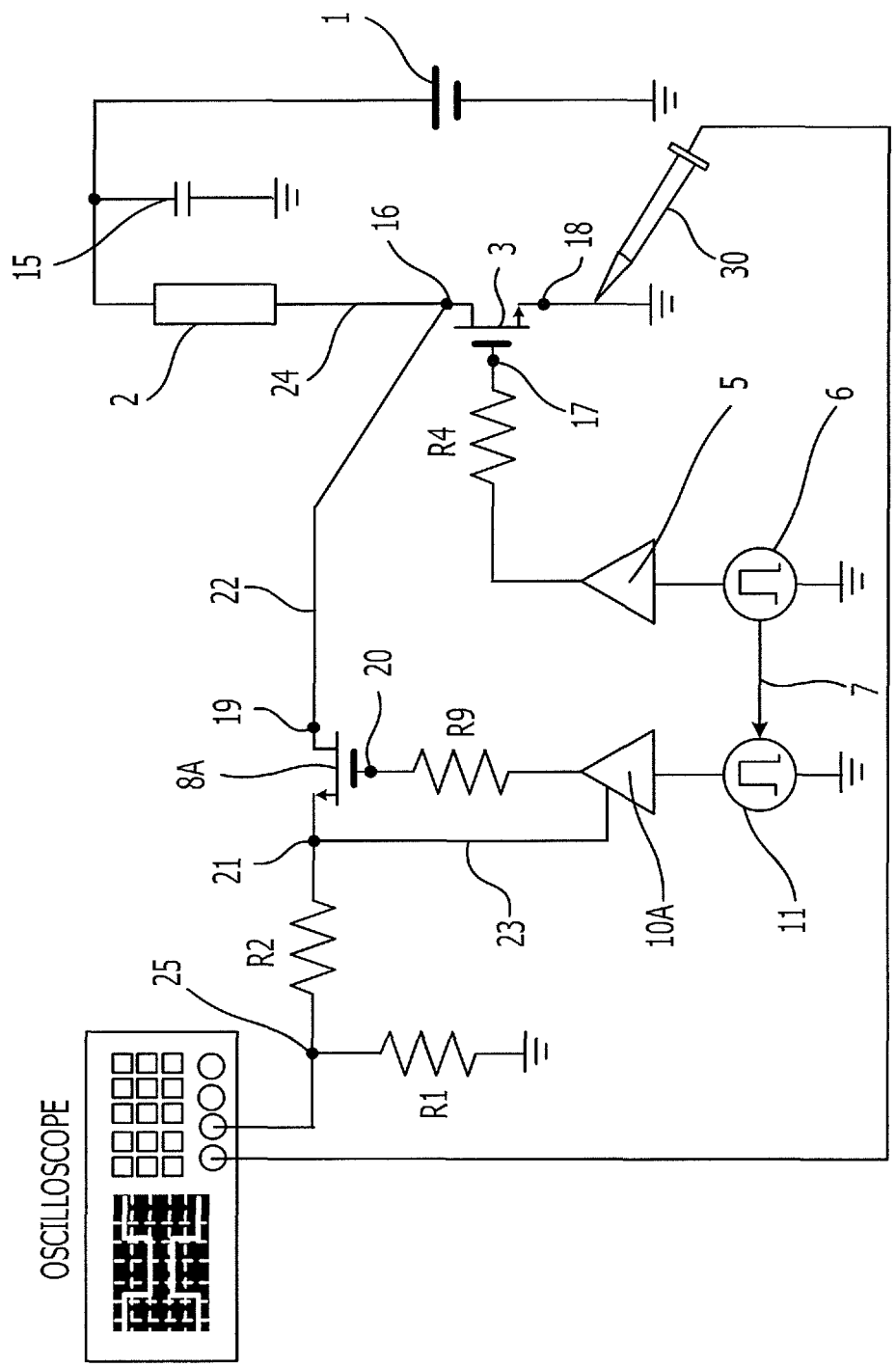
FIG. 7 is a circuit diagram of a voltage detection circuit according to a first embodiment.

FIG. 7 is a circuit diagram of a voltage detection circuit according to a first embodiment, which is a specific example of the principles of present disclosure. As the target measurement transistor 3, for example, a power transistor for power application, that is, a field effect transistor, a MOS transistor, a bipolar transistor, a GaN-HEMT, a composite type transistor of the foregoing transistors, or an integrated circuit having the same function as that of such a transistor may be used. The drain terminal 16 of the target measurement transistor 3 is connected to a connection line 24 to which the power supply source 1, a capacitor 15, and the load 2, and the source terminal 18 is grounded. The gate terminal 17 is connected to the one terminal of the gate resistor R4 and the other terminal of the gate resistor R4 is connected to the output terminal of the gate driver 5 that drives the target measurement transistor 3.

As the gate driver 5 that drives the target measurement transistor 3, for example, a transistor having a configuration of a complementary transistor or a configuration of a single single-end transistor in an output stage may be used, and the transistor may be a field-effect transistor, a MOS transistor, a bipolar transistor, a composite type transistor of the foregoing transistors, or an integrated circuit having the same function as that of such a transistor.

An output terminal of the pulse generator 6 that controls the gate driver 5 is connected to the input terminal of the gate driver 5 that drives the target measurement transistor 3. If an output voltage of the pulse generator 6 has a voltage value which turns the target measurement transistor 3 on and off, a configuration which does not include the gate driver 5 may be employed. Also, a resistor that stabilizes the output of the gate driver 5 may be provided between the pulse generator 6 and the gate driver 5.

As a switch transistor 8A, for example, a transistor having a breakdown voltage equal to or higher than the breakdown voltage of a small power transistor or the target measurement transistor 3, and having an on-resistance sufficiently smaller than the total resistance of the voltage dividing resistor R1 and the voltage dividing resistor R2 is used, and the transistor may be a field-effect transistor, a bipolar transistor, or the like. A drain terminal 19 of the switch transistor 8A and the drain terminal 16 of the target measurement transistor 3 are line-connected by a connection line 22. A source terminal 21 of the switch transistor 8A is connected to one terminal of the voltage dividing resistor R2. The other terminal of the voltage dividing resistor R2 is connected to one terminal of the voltage dividing resistor R1, and furthermore, the other terminal of the voltage dividing resistor R1 is grounded.

One terminal of a gate resistor R9 is connected to a gate terminal 20 of the switch transistor 8A, and the other terminal of the gate resistor R9 is connected to an output terminal of a gate driver 10A that drives the switch transistor 8A. The gate driver 10A that drives the switch transistor 8A includes a control terminal and is connected to a source terminal 21 of the switch transistor 8A via a connection line 23.

In this case, as the gate driver 10A that drives the switch transistor 8A, for example, a driver having a function of shifting the level of the potential of an output terminal connected to the gate terminal 20 of the switch transistor 8A by an amount corresponding to a potential of the source terminal 21 of the switch transistor 8A and having a function of adding to the gate terminal 20 a potential difference used for turning on the switch transistor 8A to the potential of the source terminal 21 may be used. By this connection, even when the potential of the source terminal 21 of the switch transistor 8A is not 0, an output pulse of the gate driver 10A is applied correctly between the gate terminal 20 and the source terminal 21 of the switch transistor 8A.

The output terminal of the pulse generator 11 that drives the gate driver 10A is connected to an input terminal of the gate driver 10A that drives the switch transistor 8A. Furthermore, the pulse generator 11 is connected to the pulse generator 6 that controls the gate driver 5 that drives the target measurement transistor 3 via a synchronization wiring 7, and the pulse generator 11 and the pulse generator 6 generate a pulse at the same timing.

The input terminal of the oscilloscope is connected to a voltage dividing terminal 25 between the voltage dividing resistor R2 and the voltage dividing resistor R1. In this case, if the values of the voltage dividing resistor R1 and the voltage dividing resistor R2 are set, for example, such that the value of the voltage dividing resistor R1=50Ω and the value of the voltage dividing resistor R2=450Ω, the potential of the voltage dividing terminal 25 is ⅒ of the drain voltage of the target measurement transistor 3, and thus, the voltage measurement range for the input terminal of the oscilloscope may be increased tenfold.

In this embodiment, the drain voltage of the target measurement transistor 3 is measured by the oscilloscope only during a period in which the target measurement transistor 3 is on, and therefore, the sensitivity of the input range of the oscilloscope may be increased. Furthermore, the voltage measurement range for the oscilloscope is not determined by the off-voltage but is set by the upper limit of the on-voltage without using a probe including an attenuator therein, and thus, detection accuracy for the on-voltage may be improved. Also, the off-voltage may be appropriately applied to the target measurement transistor without clamping the off-voltage, thereby setting the voltage measurement range for the oscilloscope and enabling appropriate and accurate voltage detection of the on-voltage to be performed.

Figure 8:
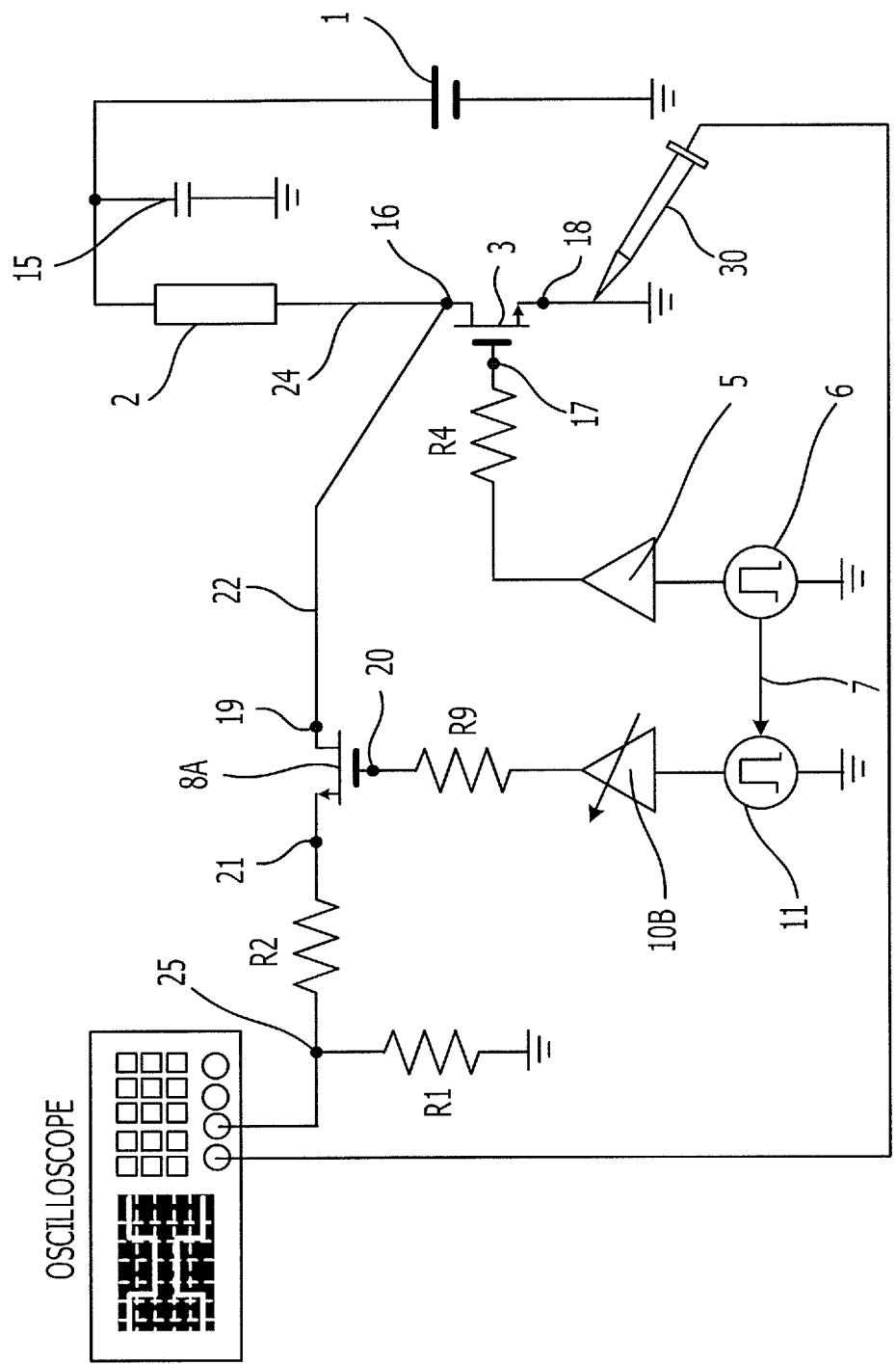
FIG. 8 is a circuit diagram of a voltage detection circuit according to a second embodiment.

FIG. 8 is a circuit diagram of a voltage detection circuit according to a second embodiment as a specific example of the principles of present disclosure. In FIG. 8, an element which is similar to or the same as that in the voltage detection circuit according to the first embodiment illustrated in FIG. 7 is identified by the same reference character and the description thereof will be omitted.

In the voltage detection circuit according to the second embodiment, instead of the gate driver 10A that drives the switch transistor 8A of the first embodiment, a gate driver 10B having a variable gain function of changing an output voltage thereof to an arbitrary value is provided.

The gate driver 10B that drives the switch transistor 8A may be a driver that changes the output voltage by changing the power supply voltage thereof.

Also, in this embodiment, the drain voltage of the target measurement transistor 3 may be measured by the oscilloscope only in a period in which the target measurement transistor 3 is on, and therefore, the sensitivity of the input range of the oscilloscope may be increased. Moreover, a probe including an attenuator therein is not used, and therefore, the on-voltage may be measured with high accuracy.

Figure 9:
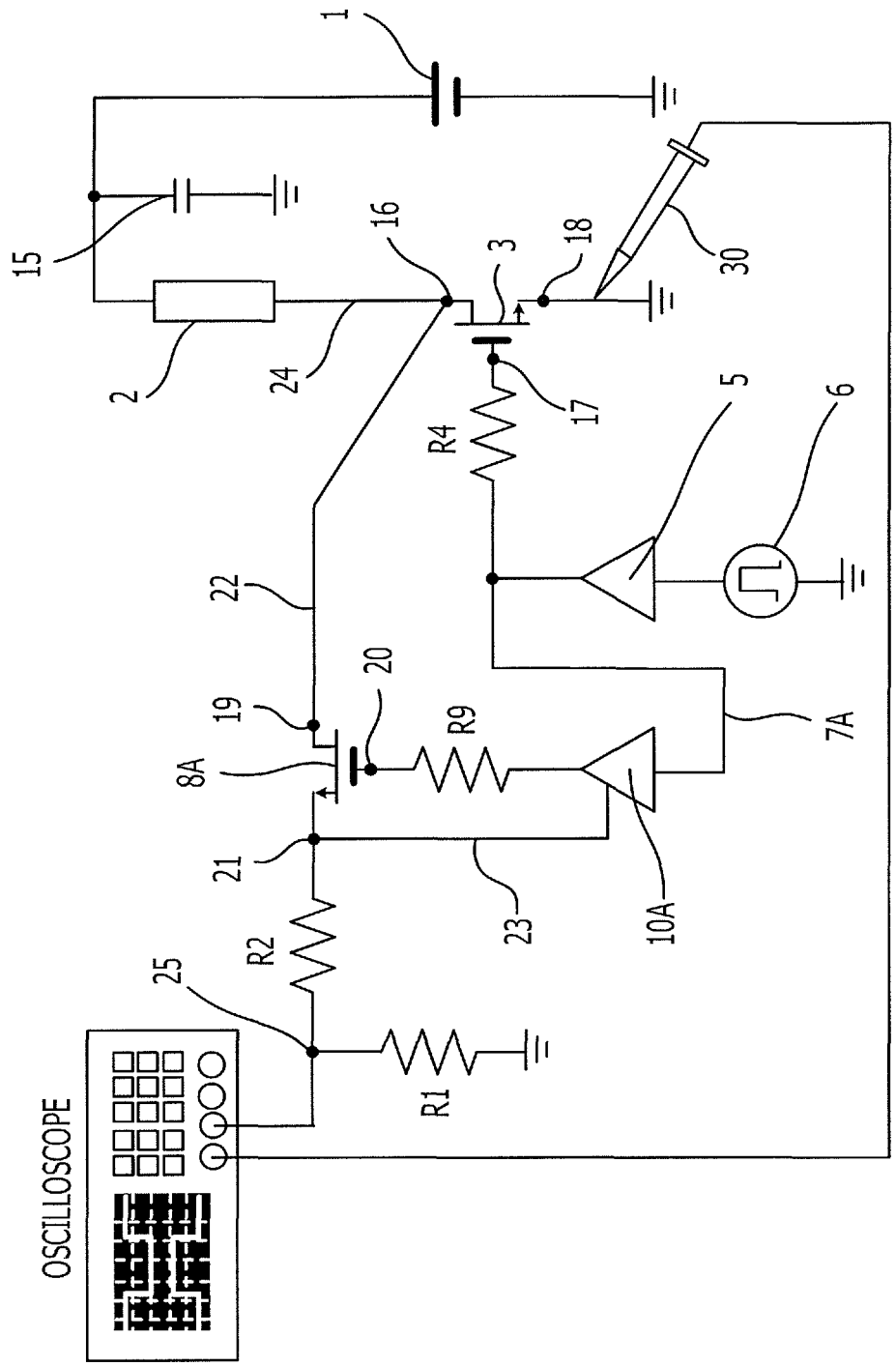
FIG. 9 is a circuit diagram of a voltage detection circuit according to a third embodiment.

FIG. 9 is a circuit diagram of a voltage detection circuit according to a third embodiment as a specific example of the principles of present disclosure. In FIG. 9, an element which is similar to or the same as that in the voltage detection circuit according to the first embodiment illustrated in FIG. 7 is identified by the same reference character and the description thereof will be omitted.

In the voltage detection circuit according to the third embodiment, the input terminal of the gate driver 10A that drives the switch transistor 8A is connected to the output of the gate driver 5A that drives the target measurement transistor 3 via a connection line 7A. As the gate driver 5A for a target measurement transistor, for example, a transistor having a configuration of a complementary transistor or a configuration of a single single-end transistor in an output stage may be used, and the transistor may be a field-effect transistor, a MOS transistor, a bipolar transistor, a composite type transistor of the foregoing transistors, or an integrated circuit having the same function as that of such a transistor. With the foregoing configuration, the switch transistor 8A is turned on and off at the same timing as the timing of turning on and off the target measurement transistor 3.

As another option, the input terminal of the gate driver 10A that drives the switch transistor 8A may be directly connected to the output terminal of the pulse generator 6 that controls the gate driver 5A via a connection line. However, in this case, the pulse generator 6 is configured to have an output capability that allows the pulse generator 6 to control two gate drives, that is, the gate driver 10A and the gate driver 5A.

Also, in this embodiment, the drain voltage of the target measurement transistor 3 may be measured by the oscilloscope only in a period in which the target measurement transistor 3 is on, and therefore, the sensitivity of the input range of the oscilloscope may be increased. Moreover, a probe including an attenuator therein is not used, and therefore, the on-voltage may be measured with high accuracy.

FIGS. 10A-10F are charts illustrating results of simulation of a case where characteristics of a power transistor are measured using the voltage detection circuit of the second embodiment.

A pulse is input to the gate of the target measurement transistor 3, response waveforms of a resistance value obtained by dividing a drain voltage, a drain current, a gate voltage, and a drain-source voltage which correspond to the pulse by a drain current are simulated.

FIG. 10A illustrates a waveform which indicates a value obtained by dividing the drain-source voltage Vds by the drain current Ids and represents an on-resistance in an on-state. FIG. 10B illustrates a pulse response waveform of the drain voltage, FIG. 10C illustrates a response waveform of the drain current, and FIG. 10D illustrates a waveform of an output from a gate driver 10B.

FIG. 10E illustrates an enlarged part of the waveform of FIG. 10A, and FIG. 10F illustrates an enlarged part of the waveform of FIG. 10B. The voltage values V (drain), V (probe), and V (bnc) illustrated in FIG. 10F are as follows.

V (drain): a potential of the drain terminal of the target measurement transistor in the measurement circuit of FIG. 3.
V (probe): a potential in the probe terminal of the probe equivalent circuit of FIG. 4. V (bnc): a potential of the voltage dividing terminal 25 of FIG. 8.

It is understood from the waveform of FIG. 10F that V (drain) is a correct value, and the result for the V (bnc) matches that of V (drain). On the other hand, V (probe) represents a negative value, and it is understood that a clearly different result was obtained. In the voltage detection circuit according to the second embodiment, the voltage in an on-state matches the value of V (drain), and the voltage in an off-state is maintained at 10 V or less. Thus, the input voltage to the oscilloscope is 1/40 or less of an actual voltage, and therefore, the input sensitivity of the oscilloscope may be increased a least about fortyfold.

Figure 11:
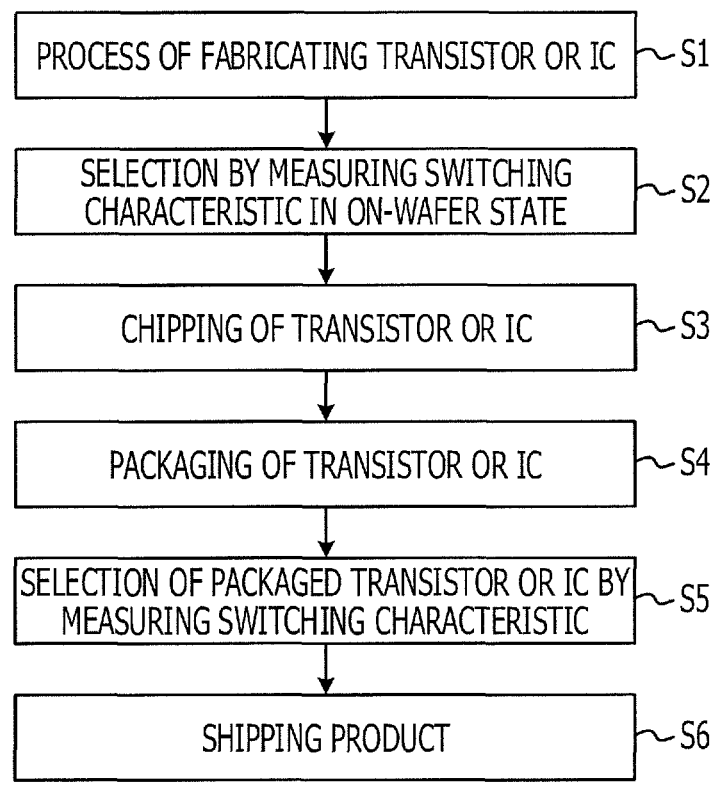
FIG. 11 is a chart illustrating fabrication process steps of fabricating a semiconductor transistor or an integrated circuit, to which a measurement method according to an embodiment is introduced.

Finally, process steps from fabrication of a semiconductor transistor or an integrated circuit (IC) to production shipment, to which a measurement method according to this embodiment is introduced, will be described with reference to FIG. 11.

First, Step S1 illustrates the process of fabricating a transistor or an IC and, in Step S1, an electrical connection is provided to a semiconductor wafer in which a transistor structure or an integrated circuit structure is formed for a test. In this stage, a needle or a probe which provides a voltage or a current is brought into contact to an electrode that is an electrical interface of a transistor or an IC to measure static and dynamic response characteristics that appear when a voltage or a current is applied thereto. A device whose static and dynamic response characteristics that fall short of a standard due to a manufacturing failure, etc., is selected (a first selection).

Next, in Step S2, an evaluation of a switching characteristic to which a voltage detection circuit according to the present disclosure is performed to appropriately select a transistor or an IC that does not perform a preferable operation (a second selection). By the first and second selections, a packaging operation in a subsequent packaging step may be excluded.

Subsequently, in Step S3, the transistor or the IC in a wafer state is cut into individual chips (elements) by dicing or the like.

Next, in Step S4, only a chip other than a chip including the transistor or the IC determined as a defect in Steps S1 and S2 is selected, resin sealing is performed, and an external connection terminal is formed, thereby performing packaging.

Then, in Step S5, the evaluation of a switching characteristic to which the voltage detection circuit according to the present disclosure is introduced is performed again to the packaged transistor or IC, and its dynamic response characteristic is evaluated to perform final selection (a third selection).

In Step S6, only a packaged transistor or IC which has passed in the selection in Step S5 is shipped out as a product.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A voltage detection circuit, comprising:
   a transistor;
   a switch coupled to the transistor, wherein a first terminal of the switch is coupled to a drain terminal of the transistor;
   a first driver that controls the switch in synchronization with a second driver that drives a gate terminal of the transistor; and
   a first resistor and a second resistor, a first end of the first resistor is coupled in series to a first end of the second resistor, wherein a second end of the second resistor is coupled to a second terminal of the switch that is opposite to the first terminal, wherein a second end of the first resistor is grounded, wherein the second end of the second resistor is electrically coupled to the drain terminal of the transistor when the switch is on, and wherein the second end of the second resistor is electrically insulated from the drain terminal of the transistor when the switch is off.

2. The voltage detection circuit according to claim 1, wherein the transistor is a field-effect transistor, a MOS transistor, a bipolar transistor, a GaN-HEMT, or a composite type of the field-effect transistor, the MOS transistor, the bipolar transistor, and the GaN-HEMT transistors.

3. The voltage detection circuit according to claim 2, wherein the switch is a field-effect or bipolar transistor and has a breakdown voltage equal to or higher than a break down voltage of the transistor.

4. A method for measuring a characteristic of a transistor, comprising:

arranging a switch, a first driver, a second driver, a first resistor and a second resistor in the periphery of the transistor, the switch is coupled to the transistor, a first terminal of the switch is coupled to a drain terminal of the transistor, the first driver controls the switch in synchronization with the second driver that drives a gate terminal of the transistor, a first end of the first resistor is coupled in series to a first end of the second resistor, a second end of the second resistor is coupled to a second terminal of the switch that is opposite to the first terminal, and a second end of the first resistor is grounded;

simultaneously turning on and off the first driver and the second driver;

calculating a drain voltage of the transistor by measuring a voltage of a connection point of the first resistor and the second resistor;

measuring an on-current of the transistor simultaneously with the voltage of the connection point of the first resistor and the second resistor; and calculating an on-resistance of the transistor based on the on-current and the voltage of the connection point of the first resistor and the second resistor, wherein the second end of the second resistor is electrically coupled to the drain terminal of the transistor when the switch is on, and wherein the second end of the second resistor is electrically insulated from the drain terminal of the transistor when the switch is off.

5. The method according to claim 4, wherein the connection point of the first resistor and the second resistor is directly coupled to an input of an oscilloscope.

* * * * *